(12) United States Patent
Kim et al.

(10) Patent No.: US 10,222,076 B2
(45) Date of Patent: Mar. 5, 2019

(54) OUTDOOR UNIT FOR AN AIR CONDITIONER

(71) Applicant: LG ELECTRONICS INC., Seoul (KR)

(72) Inventors: Okkyu Kim, Seoul (KR); Gangyoun Kim, Seoul (KR); Wonjae Yi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 191 days.

(21) Appl. No.: 15/253,325

(22) Filed: Aug. 31, 2016

(65) Prior Publication Data

US 2017/0115012 A1 Apr. 27, 2017

(30) Foreign Application Priority Data

Oct. 26, 2015 (KR) .................. 10-2015-0148886
Oct. 26, 2015 (KR) .................. 10-2015-0148887

(51) Int. Cl.
| | |
|---|---|
| *F24F 1/16* | (2011.01) |
| *F24F 1/22* | (2011.01) |
| *F24F 13/20* | (2006.01) |
| *F24F 1/24* | (2011.01) |
| *H01L 23/40* | (2006.01) |

(52) U.S. Cl.
CPC .................. *F24F 1/22* (2013.01); *F24F 1/16* (2013.01); *F24F 1/24* (2013.01); *F24F 13/20* (2013.01); *H01L 23/4093* (2013.01)

(58) Field of Classification Search
CPC ............. F24F 1/22; F24F 1/24; F28D 15/0275
See application file for complete search history.

(56) References Cited

U.S. PATENT DOCUMENTS

2010/0193164 A1* 8/2010 Wakatsuki ............... F24F 1/24
165/121

FOREIGN PATENT DOCUMENTS

| CN | 1598423 A | 3/2005 |
|---|---|---|
| CN | 102713462 A | 10/2012 |
| CN | 104247011 A | 12/2014 |
| CN | 104456722 A | 3/2015 |
| EP | 2 844 050 A1 | 3/2015 |
| EP | 2 857 764 A1 | 4/2015 |
| JP | 2006-156647 A | 6/2006 |
| JP | 2010-118606 A | 5/2010 |
| JP | 2013-194959 A | 9/2013 |
| KR | 20-2001-0001943 U | 1/2001 |
| KR | 10-2005-0028209 A | 3/2005 |
| KR | 10-2015-0031574 A | 3/2015 |

* cited by examiner

*Primary Examiner* — Ana M Vazquez
(74) *Attorney, Agent, or Firm* — Dentons US LLP

(57) ABSTRACT

An outside unit of an air conditioner that includes a compressor compressing a refrigerant; an outside heat exchanger heat-exchanging the refrigerant with outside air; and an electric unit controlling a cooling cycle in which the refrigerant is circulated, wherein the electric unit includes one surface with which a cooling pipe for cooling the electric unit is disposed to be in contact and the other surface in which a fastening part is provided.

16 Claims, 10 Drawing Sheets

OUTDOOR UNIT FOR AN AIR CONDITIONER

CROSS-REFERENCE TO RELATED APPLICATIONS

The present application claims priority under 35 U.S.C. 119 and 35 U.S.C. 365 to Korean Patent Application No. 10-2015-0148886 (filed on Oct. 26, 2015) and Korean Patent Application No. 10-2015-0148887 (filed on Oct. 26, 2015), which are hereby incorporated by reference in their entirety.

BACKGROUND

1. Field

The present disclosure relates to an outside unit of an air conditioner.

2. Background

Generally, an air conditioner is a cooling and heating system that undergoes a refrigeration cycle to heat and cool an inside space by repeatedly suctioning inside air, exchanging heat with a low temperature or high temperature refrigerant, and then discharging the heat-exchanged air into the room. When the refrigeration cycle performs a cooling operation, an outside heat exchanger serves as a condenser, and an inside heat exchanger serves as an evaporator. Alternatively, when the refrigeration cycle performs a heating operation, the inside heat exchanger serves as a condenser and the outside heat exchanger serves as an evaporator.

The outside unit generally includes an electric unit for driving the air conditioner. The electric unit includes a plurality of control components, which generate a lot of heat. The heating temperature of the electric unit may be approximately 70 to 80° C.

Korean Patent Publication No. 10-2007-0097001, titled "An Outside Unit For An Air Conditioner," ("Korean '001 Publication) discloses a conventional air conditioner, such as described above, and explains that the electric unit will malfunction when it is not sufficiently cooled. To cool the electric unit, Korean '001 Publication discloses disposing a board having high thermal conductivity on one side of the electric unit, and a method for exchanging heat by outside air (heat-sink). However, this is problematic because the effect of such a heat-sink method is limited to the area in which a temperature of outside air is very high (in one example, about 50° C.).

Accordingly, to solve the above problem, recently, a cooling device through which a refrigerant of the refrigeration cycle is flowing is provided at one side of the electric unit, and a technology in which the cooling of the electric unit is made by the heat exchange between the refrigerant and the electric unit is introduced. In one example, the cooling device may include a refrigerant pipe.

Meanwhile, to improve the efficiency of heat transfer, the electric unit should be in close proximity with the cooling device, but there is a difficulty in fastening during assembly of the outside unit, as well as a problem in which the electric unit is damaged due to the movement of the cooling device.

Also problematic is that when the electric unit needs to be repaired or a driving part of the outside unit needs to be replaced, the cooling device or the refrigerant pipe must be removed after discharging all of the refrigerant, and then when the repair or replacement work is completed, the cooling device or the refrigerant pipe must be assembled again, and then the refrigerant should be recharged.

SUMMARY

The present disclosure is directed to providing an air conditioner which may efficiently cool an electric unit by improving the fastening structure of a heat radiating part and the electric unit.

Also, the present disclosure is directed to providing an air conditioner which may conveniently remove a cooling pipe from an electric unit.

According to an aspect of the present disclosure, there is provided an air conditioner including a compressor to compress a refrigerant, an outside heat exchanger to heat-exchange the refrigerant with outside air, and an electric unit to control a cooling cycle in which the refrigerant is circulated, wherein the electric unit comprises a heat sink including a first surface at which a cooling pipe for cooling the electric unit is attached and a second surface at which a fastening part is provided, an electric board having a first penetration part, the electric board being spaced apart from a side of the heat sink, a heating element having a second penetration part in communication with the first penetration part, the heating element being provided between the heat sink and the electric board, a fixing guide having a third penetration part in communication with the first and second penetration parts, the fixing guide being provided between the heating element and the electric board, and a fastening member attaching the heat sink with the heating element, wherein the fastening member comprises a head part supported at one side of the third penetration part through the first penetration part, and a screw part that extends from the head part to the heating element and is attached to the fastening part of the heat sink.

According to another aspect of the present disclosure, there is provided an air conditioner including a compressor to compress a refrigerant, a heat exchanger to heat-exchange the refrigerant with outside air, an electric unit to control a cooling cycle in which the refrigerant is circulated, a heat radiating part attached to the electric unit to cool the electric unit, wherein the heat radiating part comprises a heat sink to transfer heat of the electric unit to the refrigerant, the heat sink being attached to the electric unit, a cooling pipe to guide a flow of a refrigerant for cooling the electric unit, the cooling pipe being provided at the heat sink, and a cover structure to cover the cooling pipe, the cover being detachably fastened to one surface of the heat sink, wherein, when the cover structure is separated from the heat sink, the cooling pipe may be spaced apart from the heat sink, and when the cover structure is attached to the heat sink, the cooling pipe is in contact with the heat sink.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Reference will now be made in detail to the embodiments of the present disclosure, examples of which are illustrated in the accompanying drawings. It is understood that the description herein is not intended to limit the claims to the specific embodiments described. On the contrary, it is intended to cover alternatives, modifications, and equivalents as may be included within the spirit and scope of the present disclosure.

Figure 1:
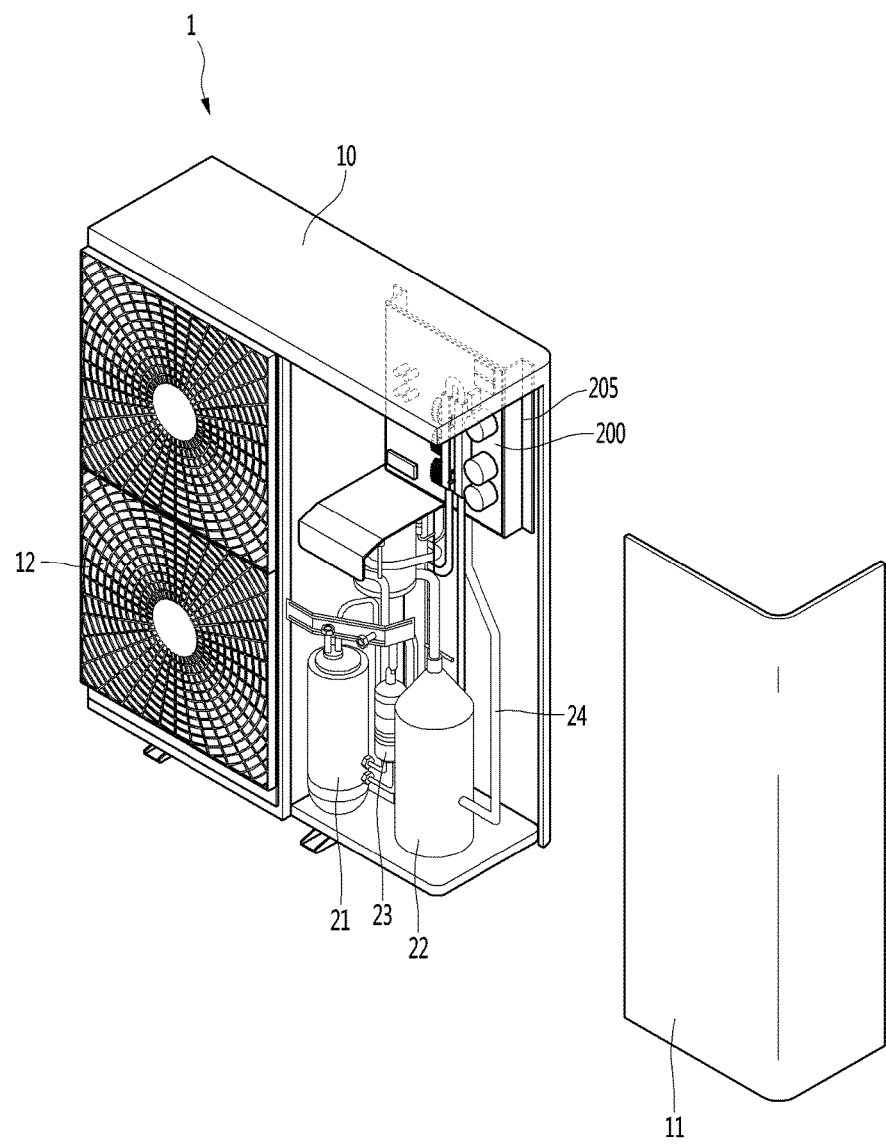
FIG. 1 is a perspective view of an outside unit of an air conditioner according to an embodiment of the present disclosure.
Figure 2:
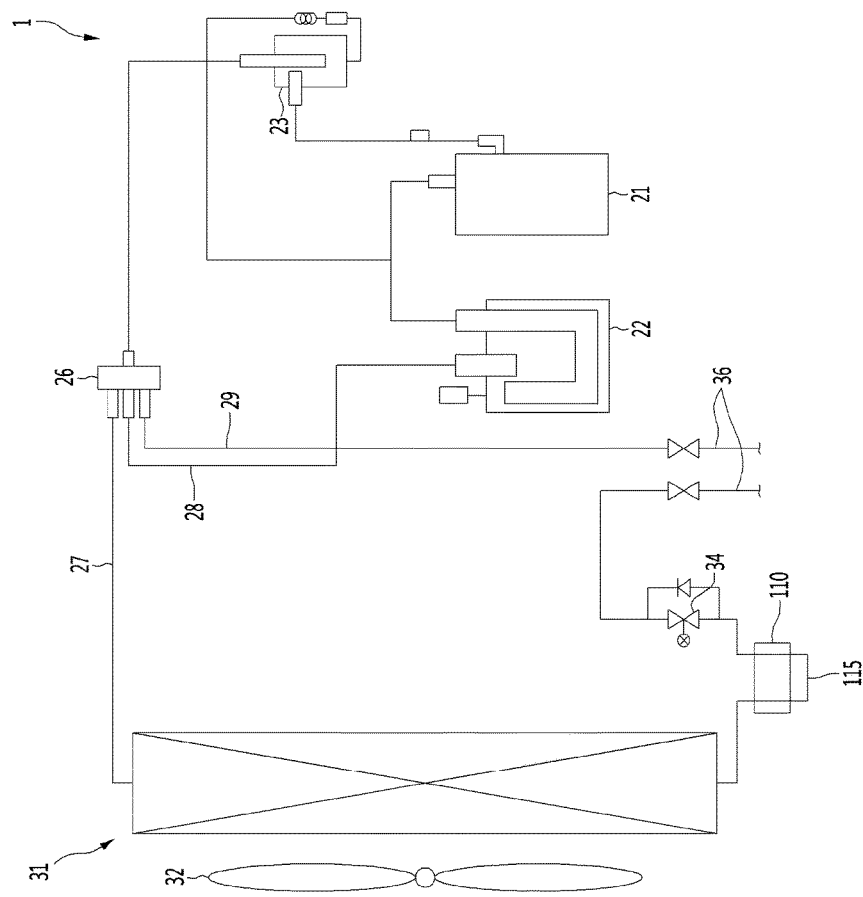
FIG. 2 is a view illustrating an internal structure of the outside unit according to an embodiment of the present disclosure.

FIG. 1 is a perspective view of an outside unit of an air conditioner according to an embodiment of the present disclosure. FIG. 2 is a view illustrating an internal structure of the outside unit according to an embodiment of the present disclosure.

Referring to FIGS. 1 and 2, an air conditioner according includes an outside unit 1 exchanging heat with outside air, and an inside unit (not shown) disposed in an interior (inside) space and conditioning inside air.

As illustrated, the outside unit 1 may include a case 10 forming an outer appearance and accommodating a plurality of components. The case 10 may include a suction part (not shown) to suction outside air and an outlet part 12 through which the suctioned air is discharged after being heat-exchanged. The outlet part 12 may be formed at a front side of the case 10.

A compressor 21 described later, a gas liquid separator 22, an oil separator 23, an outside heat exchanger 31 and an outside fan 32 is provided in the inside of the case 10. The compressor 21, the gas liquid separator 22, the oil separator 23, the outside heat exchanger 31 and the outside fan 32 may be installed on an upper side of a base constituting a bottom surface of the outside unit 1.

A plurality of refrigerant pipes 24 guiding a refrigerant which is circulating the outside unit 1 are provided inside the case 10. The refrigerant pipe 24 is communicated with a cooling pipe 115 passing through a heat radiating part 100, which is described below.

An electric unit 200 detachably coupled from the case 10 is provided at the inner side surface of the case 10. For example, the electric unit 200 may be detachably coupled to the upper side of a rear surface of the outside unit 1. An electric panel 205 for fastening the electric unit 200 may be further included at the inner side surface of the case 10, and the electric unit 200 may be detachably fastened to the electric panel 205. The configuration of the cooling pipe 115 and the electric unit 200 is described below.

An outside unit cover 11 may be further included in the case 10. The outside unit cover 11 may selectively open the internal structure of the outside unit 1, and as the outside unit cover 11 is opened, the electric unit 200 may be visible to the outside such that it may be installed and repaired by an administrator. The outside unit cover 11 may be configured to open at least one surface of the outside unit 1. For example, the outside unit cover 11 may be rounded so as to open a front surface and a side surface of the outside unit 1.

The outside unit 1 includes a compressor 21 that compresses a refrigerant, and an oil separator 23 disposed at an outlet side of a plurality of compressors 21 to separate oil among the refrigerant discharged from the plurality of compressors 21.

A flow switching part 26 to guide the refrigerant discharged from the compressor 21 to the outside heat exchanger 31 or an inside unit (not shown) side is provided at an outlet side of the oil separator 23. For example, a four-way valve may be included in the flow switching part 26. The flow switching part 26 may be connected with a first connection pipe 27 connected to the outside heat exchanger 31, a second connection pipe 28 connected to the gas liquid separator 22 and a third connection pipe 29 connected to the inside unit (not shown).

When the air conditioner performs a cooling operation, a refrigerant is introduced from the flow switching part 26 to the outside heat exchanger 31 via the first connection pipe 27. On the other hand, when the air conditioner performs a heating operation, the refrigerant flows from the flow switching part 26 to an inside heat exchanger side of the inside unit (not shown) via the third connection pipe 29.

The outside heat exchanger 31 does heat-exchanging between the outside air and the refrigerant, and when the air conditioner performs a cooling operation, serves as a condenser, and when the air conditioner performs a heating operation, serves as an evaporator.

When the air conditioner performs a cooling operation, the refrigerant passing through the outside heat exchanger 31 passes through the cooling pipe 115. The cooling pipe 115 may be disposed at an outlet side of the outside heat exchanger 31 based on the cooling operation. The refrigerant flowing in the cooling pipe 115 cools the electric unit 200 fastened to the heat radiating part 100. A detailed description of the heat radiating part 100 and the electric unit 200 is described below.

The refrigerant passing through the heat sink 110 passes through a main expansion valve 34 (electronic expansion valve) provided at an outlet side of the cooling pipe 115. During a cooling operation, since the main expansion valve 34 is completely open, a pressure reducing action of the refrigerant is not performed.

The refrigerant passing through the expansion valve 34 flows to the inside unit through an inside unit connection pipe 36, and a refrigerant evaporated in the inside heat exchanger (not shown) is introduced to the outside unit 1 via the inside unit connection pipe 36.

The refrigerant introduced to the outside unit 1 is introduced to the flow switching part 26 via the third connection pipe 29 and discharged from the flow switching part 26 via the second connection pipe 28. The refrigerant passing through the flow switching part 26 flows into the gas liquid separator 22. The gas liquid separator 22 is configured so that a gas refrigerant is separated before the refrigerant is introduced to the compressor 21. The separated gas refrigerant may be introduced to the compressor 21.

Figure 3:
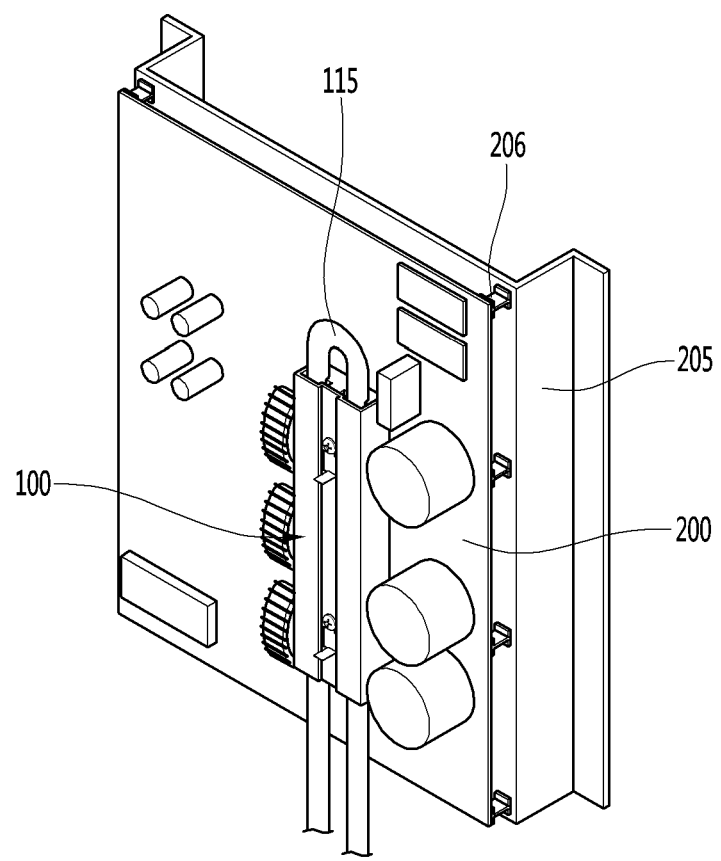
FIG. 3 is a perspective view illustrating an electric unit of the outside unit according to an embodiment of the present disclosure.
Figure 4:
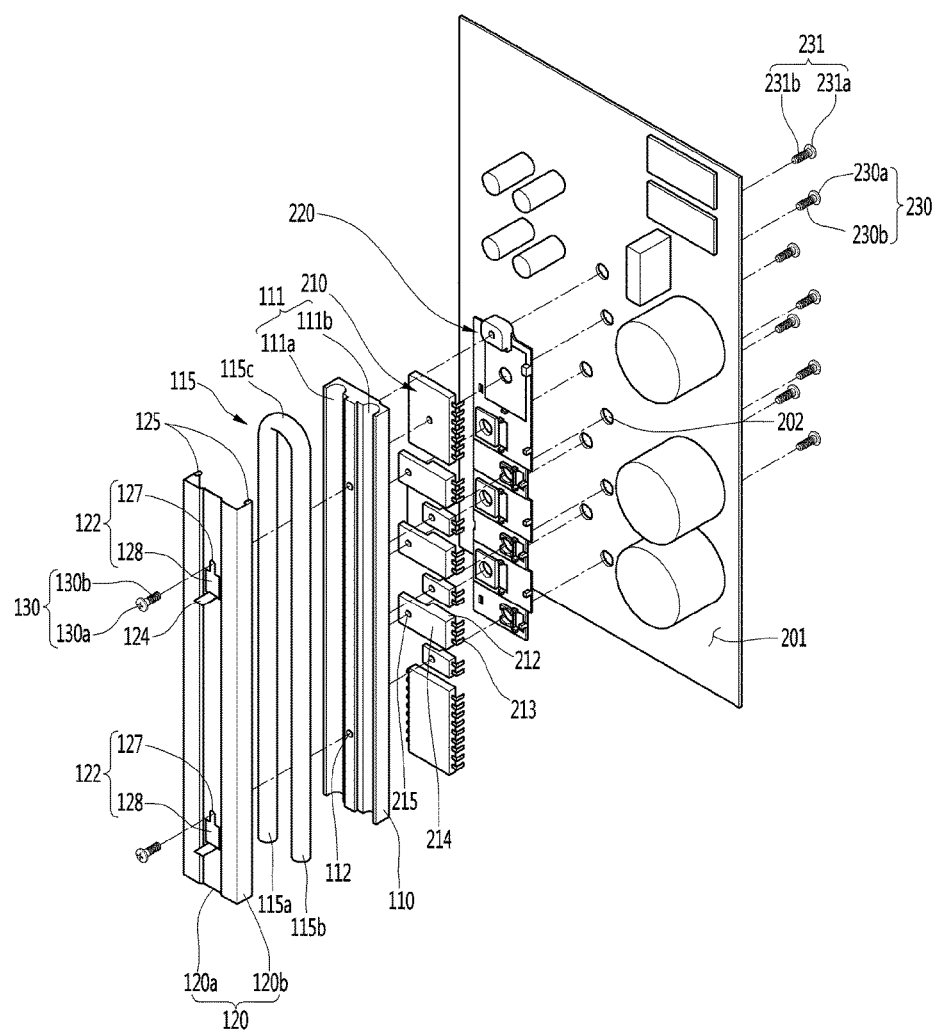
FIG. 4 is an exploded perspective view illustrating the electric unit of the outside unit according to an embodiment of the present disclosure.
Figure 5:
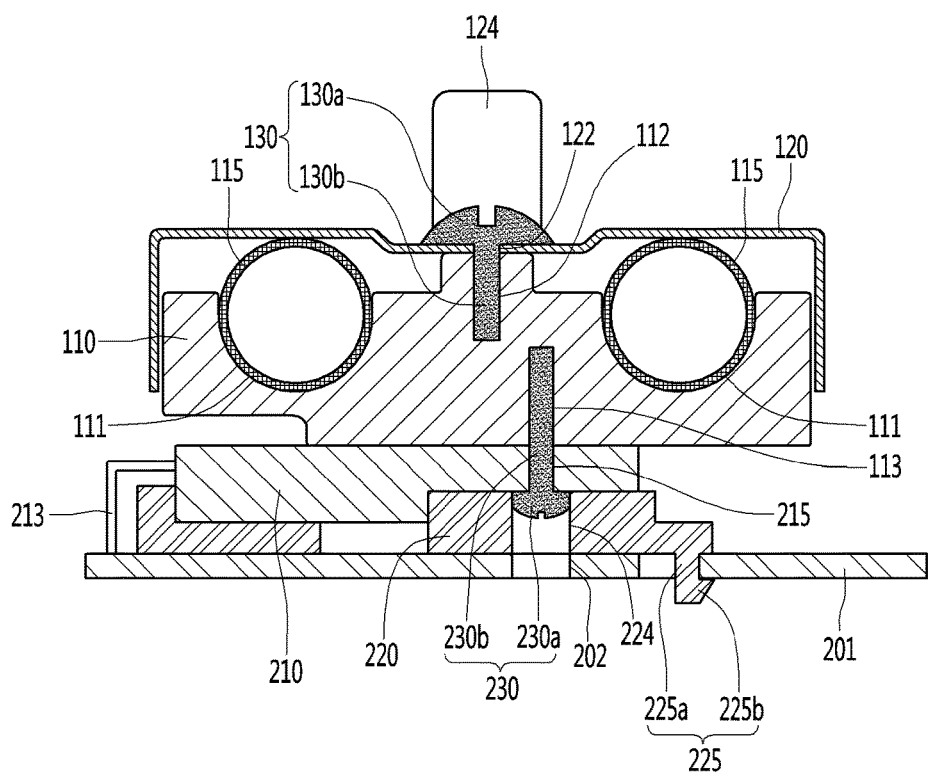
FIG. 5 is a cross-sectional view illustrating the electric unit of the outside unit according to an embodiment of the present disclosure.
Figure 6:
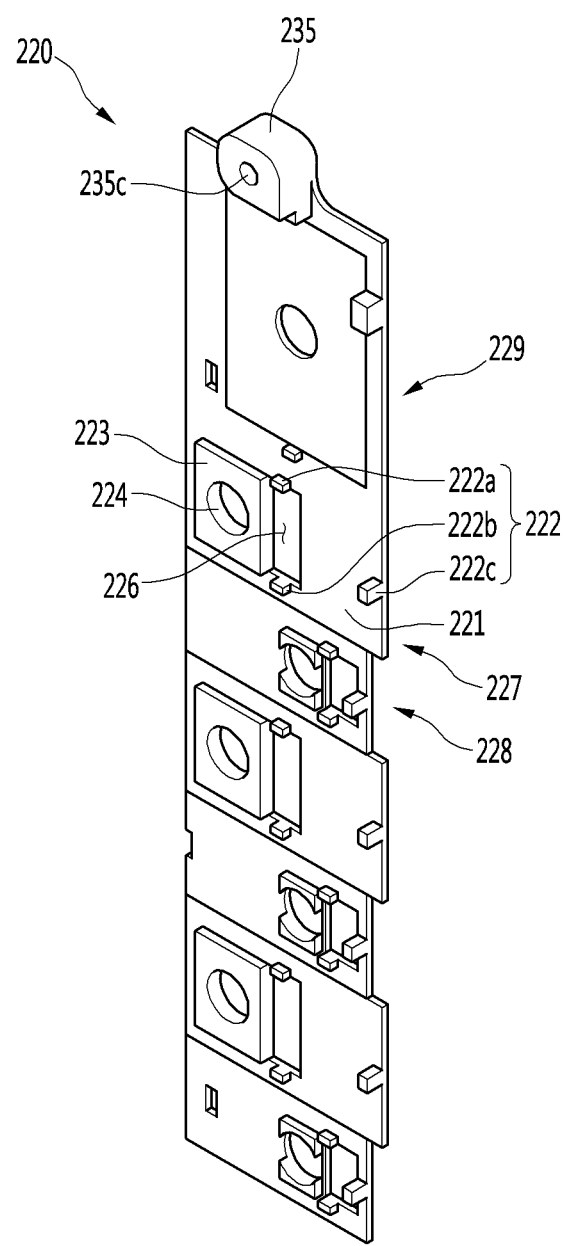
FIG. 6 is a perspective view illustrating a front surface of a fixing guide according to an embodiment of the present disclosure.
Figure 7:
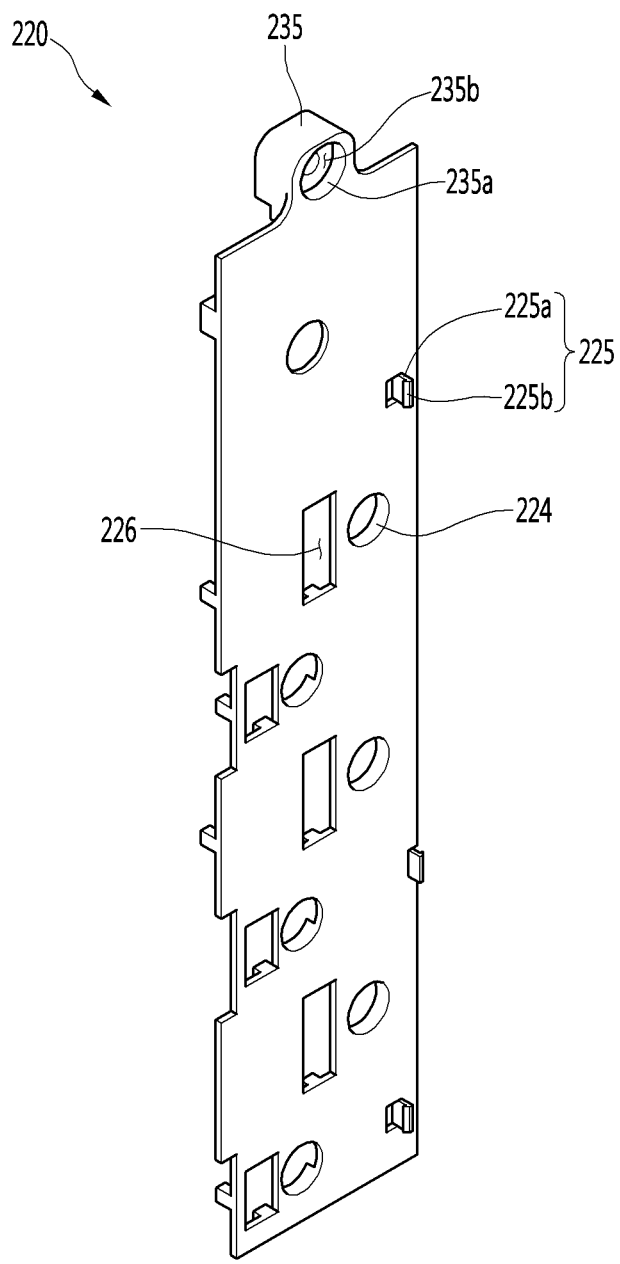
FIG. 7 is a perspective view illustrating a rear surface of the fixing guide according to an embodiment of the present disclosure.

FIG. 3 is a perspective view illustrating an electric unit of the outside unit according to an embodiment of the present disclosure. FIG. 4 is an exploded perspective view illustrating the electric unit of the outside unit according to an embodiment of the present disclosure. FIG. 5 is a cross-sectional view illustrating the electric unit of the outside unit according to an embodiment of the present invention. FIG. 6 is a perspective view illustrating a front surface of a fixing guide according to an embodiment of the present disclosure. FIG. 7 is a perspective view illustrating a rear surface of the fixing guide according to an embodiment of the present disclosure.

Referring to FIGS. 4 through 7, the outside unit 1 the air conditioner may include the heat radiating part 100 for cooling the electric unit 200.

The heat radiating part 100 may include at least one of a heat sink 110 to receive and discharge heat of the electric unit 200, a cooling pipe 115 in which a refrigerant cooling the heat sink 110 flows, a pipe seating part 111 provided at one surface of the heat sink 110 to receive the cooling pipe 115, a plurality of fastening parts 112 and 113 for attaching the heat sink 110, and a cover 120 attaching or securing the cooling pipe 115 to the heat sink 110.

The heat sink 110 absorbs the heat of the electric unit 200 and discharges the heat to a refrigerant passing through the cooling pipe 115. More particularly, the heat sink 110 may be composed with a high thermal conductivity metal or heat transmittable plastic. The heat transmittable plastic is preferably a material which includes properties of a plastic, that is a small weight, free design and low coefficient of thermal expansion, and has a heat transfer property of a metal and ceramic. For example, the heat sink 110 may include aluminum as a metal material.

In another example, the heat sink 110 includes polyethylene which polymerizes ethylene (—[CH2CH2]n-) and a carbon nanotube (CNT) as the heat transmittable plastic. The heat transmittable plastic may have a thermal conductivity more than 100 times compared with a thermal conductivity of the general plastic.

The cooling pipe 115 may be extended from the refrigerant pipe 24, and the refrigerant passing through the outside heat exchanger 31 may be flowed. More particularly, the cooling pipe 115 may include a first cooling pipe 115a to guide a flow of a refrigerant in one direction and a second cooling pipe 115b to guide the flow of refrigerant in another direction. The cooling pipe 115 may further include a switching pipe 115c coupled between the first cooling pipe 115a and the second cooling pipe 115b. The switching pipe 115c may be rounded or bent to switch a flow direction of the refrigerant. As shown, the first and second cooling pipes 115a and 115b may extend parallel to each other such that the cooling pipe 115 may be understood to form two rows.

The heat generated from the electric unit 200 forms a temperature of approximately 70 to 80° C., and since the refrigerant passing through the outside heat exchanger 31 has a temperature of approximately 30° C., the refrigerant may effectively cool the electric unit 200. The refrigerant passing through the cooling pipe 115 flows into the expansion valve 34.

The pipe seating part 111 may be formed at a front surface of the heat sink 110. As shown in FIG. 4, for example, the pipe seating part 111 may be shaped to correspond to the shape of the cooling pipe 115 so that at least a part of the cooling pipe 115 may be accommodated therein. Here, a front surface or front is a direction in which an outlet port is formed based on the outside unit.

The shape of the pipe seating part 111 may correspond to an extending direction of the cooling pipe 115. For example, when the cooling pipe 115 is extended in a vertical direction, the pipe seating part 111 includes a groove recessed in the vertical direction. In another example, when the cooling pipe 115 is extended in a transverse direction, the pipe seating part 111 includes a groove recessed in the transverse direction.

The pipe seating part 111 may be depressed from one side end to the other side end of the heat sink 110, and may be extended. Therefore, the cooling pipe 115 is elongated from the one side to the other side of the heat sink 110, and at least a portion of the cooling pipe 115 may be seated on the pipe seating part 111.

The pipe seating part 111 may be configured in multiple rows corresponding to the number of rows of the cooling pipe 115. More particularly, the pipe seating part 111 may include a plurality of receiving parts. Each of the plurality of receiving parts may include a first receiving part 111a and a second receiving part 111b. The first and second receiving parts 111a and 111b may extend in parallel corresponding to the first and second cooling pipes 115a and 115b.

As shown in FIG. 4, the first receiving part 111a and the second receiving part 111b may be spaced apart from each other.

The recessed shape of the pipe seating part 111 may have a shape corresponding to the outer surface of the cooling pipe 115. For example, if the cooling pipe 115 has a circular pipe, the recessed shape of the pipe seating part 111 may be curved to have a curvature corresponding to the curvature of the cooling pipe 115. It is understood that the cooling pipe 115 and the pipe seating part 111 are not limited to being circular or curved, and any shape may be adopted if configured to maximize a contact surface.

The fastening parts 112, 113, and 114 each include a groove or a hole recessed into an inner side of the heat sink 110. The diameters of the fastening parts 112 and 113 respectively correspond to outer diameters of screw parts of fastening members 130 and 230. A screw thread corresponding to a screw thread formed at outer circumferential surfaces of the fastening members 130, 230 and 231 may be formed at the inside of the fastening parts 112, 113, and 114.

The fastening parts 112, 113, and 114 include a cover fastening part 112, a heating element fastening part 113, and a fixing guide fastening part 114.

More specifically, as shown, the cover fastening part 112 may be formed at the front surface of the heat sink 110, and a cover fastening member 130 (e.g., screw or bolt) may be inserted in the cover fastening part 112. The cover 120 may be coupled to the heat sink 110 by the cover fastening member 130.

The heating element fastening part 113 may be formed at a rear surface of the heat sink 110, and a heating element fastening member 230 may be inserted in the heating element fastening part 113. A heating element 210 may be coupled to the heat sink 110 by the heating element fastening member 230.

The fixing guide fastening part 114 may be formed at the rear surface of the heat sink 110, and a fixing guide fastening member 231 may be inserted in the fixing guide fastening part 114. A fixing guide 220 (described below) may be coupled to the heat sink 110 by the fixing guide fastening member 231. A more detailed description of the heating element fastening part 113, the heating element fastening member 230, the fixing guide fastening part 114, and the fixing guide fastening member 231 is provided below.

The cover fastening part 112 may be located between first and second pipe seating parts 111a and 111b. For example, the cover fastening part 112 may be separated from each other and provided in plural. The cover 120 may be fastened to the front surface of the heat sink 110 and may fix the cooling pipe 115 to the heat sink 110.

More specifically, the cover 120 may be fastened to the heat sink 110 by the cover fastening part 112 and the cover fastening member 130, such that the cooling pipe 115 is located between the cover 120 and the heat sink 110. According to this configuration, at least a portion of the cooling pipe 115 may be disposed to be contactable with the heat sink 110.

The cover 120 may be formed to surround the front and side surfaces of the heat sink 110. The cover may be formed in a bent plate shaped as letter ' ⊂ ' when seen from the upper side. More particularly, the cover 120 may include a cover main body 120a forming a front surface and a side surface part 120b, the cover main body 120a being elongated in a vertical direction and the side surface part 120b being extended from both sides to the rear.

The cover main body 120a may include a cover penetration part 122 through which the cover fastening member 130 passes. The cover 120 may be coupled to the heat sink 110 by the cover fastening member 130.

The cover fastening member 130 may include a screw including a head part 130a and a screw part 130b in which a screw thread is formed. The head part 130a may have a substantially hemispherical shape, and a coupling groove formed therein to which a tool may be coupled. The screw part 130b is extended toward the heat sink 110 from the head part 130a. That is, the screw part 130b is inserted in the cover fastening part 112 and may be screwed by the screw thread.

The cover penetration part 122 may include a first penetration part 127 and a second penetration part 128 extended from the first penetration part 127.

The head part 130a of the cover fastening member 130 is not configured to pass through the first penetration part 127, but may be configured to pass through the second penetration part 128. More particularly, the first penetration part 127 is larger than an outer diameter of the screw part 130b of the cover fastening member 130 and may be smaller than an outer diameter of the head part 130a. The second penetration part 128 may be formed larger than the outer diameter of the head part 130a of the cover fastening member 130.

Therefore, when the cover fastening member 130 is located so as to penetrate the first penetration part 127 of the cover 120 while the cover fastening member 130 is fastened to the cover fastening part 112, the cover 120 is restricted from being separated from the heat sink 110. This is because, the diameter of the head part 130a is larger than the first penetration part 127.

Alternatively, when the cover fastening member 130 is located so as to penetrate the second penetration part 128 of the cover 120 while the cover fastening member 130 is fastened to the cover fastening part 112, the cover 120 may be separated from the heat sink 110. This is because, the diameter of the head part 130a is smaller than the second penetration part 128.

Accordingly, the cover 120 may not be separated from the heat sink 110 while the cover fastening member 130 is fastened to the cover fastening part 112 through the first penetration part 127, but the cover 120 may be separated from the heat sink 110 while the cover fastening member 130 is fastened to the cover fastening part 112 through the second penetration part 128.

Meanwhile, a portion extended from the first penetration part 127 to the second penetration part 128 may be larger than the outer diameter of the screw part 130b of the cover fastening member 130. Therefore, the cover 120 may be slid in an extending direction of the cover penetration part 122. When the cover 120 is slidably moved, the cover fastening member 130 may be moved from the first penetration part 127 to the second penetration part 128 or from the second penetration part 128 to the first penetration part 127 while in a state of being fastened to the cover fastening part 112.

That is, the cover 120 may be moved within a certain range or distance in a state in which the cover fastening member 130 is fastened to the cover fastening part 112. That is, the cover 120 may slide in a direction in which the first and second penetration parts 127 and 128 are extended with the front surface of the heat sink 110 as a supporting surface.

The first penetration part 127 may be located above the second penetration part 128. When sliding the cover 120 to an upper side, the cover fastening member 130 passing through the first penetration part 127 deviates from the first penetration part 127 and may pass through the second penetration part 128. On the other hand, when sliding the cover 120 to a lower side, the cover fastening member 130 passing through the second penetration part 128 deviates from the second penetration part 128 and may pass through the first penetration part 127.

A plurality of cover penetration parts 122 may be provided corresponding to the number of the cover fastening parts 112. For example, when a plurality of cover fastening parts 112 are spaced apart in a vertical direction, the plurality of cover penetration parts 122 may also be spaced apart in the vertical direction.

The cover 120 may further include a handle 124 by which an operator may slide the cover 120. The handle 124 may protrude from any surface of the cover 120. For example, the handle 124 may protrude forward from one side of the second penetration part 128 so that a user may easily grip the cover 120. More particularly, the handle 124 may protrude from a lower end of the second penetration part 128.

The handle 124 may be integrally formed with the cover penetration part 122. That is, the cover penetration part 122 may be formed, for example, by punching processing a rear surface of the cover 120, and through the punching process, a portion of the cover penetration part 122 may be cut and the rest may not be cut. At this time, the handle 124 may be formed by bending the non-cut remaining portion to the front of the cover 120.

The cover 120 may further include a cover hanging part 125 so that the cover 120 is stably fastened to the heat sink 110. For example, the cover hanging part 125 may be formed at an upper end of the side surface part 120b, and may be supported by an upper surface of the heat sink 110.

The electric unit 200 may include an electric board 201 and a plurality of heating elements 210 disposed in the electric board 201. The heating element fastening member 230 may fasten the heating element 210 to the heat sink 110.

A plurality of elements may be disposed on the electric board 201 and the plurality of elements may include the plurality of heating elements 210. As shown in FIG. 4, the plurality of elements may be disposed on a front surface of the electric board 201.

The electric board 201 may be fastened so as to be separated from the electric panel 205. For example, a plurality of fastening means 206 for being fastened to the electric panel 205 may be provided at a rear surface of the electric board 201. The electric board 201 may include a plurality of board penetration parts 202 (e.g., openings).

The heating element fastening member 230 or the fixing guide fastening member 231 (described below) may be a screw including head parts 230a and 231a and screw parts including screw threads 230b and 231b. The board penetration part 202 may have a larger area than an outer diameter of the head part 230a of the heating element fastening member 230 or that of the head part 231a of the fixing guide fastening member 231.

Accordingly, the heating element fastening member 230 or the fixing guide fastening member 231 is not fastened to the electric board 201, but during assembly of the electric unit 200, the operator may fasten the configuration disposed on a front surface of the board penetration part 202 through the board penetration part 202.

The heating element 210 may include a power module, such as an Intelligent Power Module (IPM). The IPM is understood as a driving circuit of a power device such as a power MOSFET or IGBT controlling power, and a module installing a protection circuit of a self-protection function. The power module may be referred to as a "power element". The electric board 201 may be a configuration of the IPM. When the power module is driven, heat of a high temperature approximately at 70 to 80° C. may be generated by on-off operations of a switching element provided in the power module. The heating element 210 may further include a microcomputer, inverter, converter, EEPROM, rectification diode, and/or condenser.

The heating element 210 may include at least one or a plurality of legs 213 electrically connecting an element main body 212 performing the function of the heating element 210, an electrode of the electric board 201 and the element main body 212, and fixing the heating element 210 to the electric board 201, and an element heat radiating part 214 for discharging heat of the element main body 212.

The plurality of legs 213 configure an electrode of the heating element 210 and are extended from the element main body 212. The number of legs 213 may be equal to the number of electrodes of the heating element 210. The plurality of legs 213 may be provided at one surface of the element main body 212. For example, the plurality of legs 213 may be provided at any one side surface of the element main body 212. In another example, the plurality of legs 213 may be provided symmetrically at both sides based on the element main body 212.

The element main body 212 may have a shape of a flat rectangular parallelepiped. The side surface of the element main body 212 is understood as having the shape of a rectangle formed in four directions among the rectangular parallelepiped. However, it is understood that the shape of the element main body 212 is not limited to such shape.

The leg 213 may penetrate the electric board 201 and be coupled to an electrode provided on the electric board 201. According to such configuration, the heating element 210 may be fixed to the electric board 201.

The leg 213 may be bent as letter "┐" shape so that the element main body 212 is disposed to face the electric board 201. At this time, a front surface of the element main body 212 may be disposed to face the front surface of the electric board 201 and the element heat radiating part 214 may be disposed so as to face the rear surface of the heat sink 110.

The element heat radiating part 214 may be configured at a rear surface of the element main body 212 or may be configured to be extended from one surface of the element main body 212. The element main body 212 or the element heat radiating part 214 may include an element penetration part 215 for being fastened to the heat sink 110.

The size of the element penetration part 215 is smaller than the outer diameter of the head part 230a of the heating element fastening member 230, and may be formed to a size corresponding to an outer diameter of the screw part 230b of the heating element fastening member 230. Therefore, when the heating element 210 and the heat sink 110 are fastened to each other, the screw part 230b of the heating element fastening member 230 passes through the element penetration part 215 and is accommodated in the heating element fastening part 113. In addition, the head part 230a of the heating element fastening member 230 may press the element heat radiating part 214 and cause the element heat radiating part 214 to be in close contact with the heat sink 110.

Thus, when the element heat radiating part 214 and the heat sink 110 are in contact with each other, the heat exchange efficiency may be improved, and heat of the heating element 210 may be rapidly conducted to the heat sink 110. At this time, thermal grease, a thermal compound, or thermal pad which may boost the heat exchange efficiency may be coated between the element heat radiating part 214 and the heat sink 110.

Referring to FIGS. 6 and 7, the electric unit 200 may further include a fixing guide 220 attaching the heating element 210 to the electric board 201, and a fixing guide fastening member 231 attaching the fixing guide 220 to the heat sink 110.

The fixing guide 220 may be interposed between the electric board 201 and the heating element 210. The fixing guide 220 may accommodate the element main body 212 and the head part 230a of the heating element fastening member 230, and support the heating element 210. Thus, because the fixing guide 220 causes the electric board 201 and the heating element 210 to be attached to one another while being spaced apart, the fixing guide 220 may be referred to as a 'spacer'.

However, when the leg 213 of the heating element 210 is a heating element 210 provided symmetrically in both directions based on the element main body 212, there is no difficulty in the engagement with the heat sink 110, and since breakage concern of the heating element 210 is relatively small, it may not be accommodated in the fixing guide 220.

The fixing guide 220 may include at least one of a first fixing unit 227, a second fixing unit 228, and a third fixing unit 229. The first, second and third fixing units 227, 228, and 229 may be each configured in multiple pieces depending on the number of the heating elements 210, and according to the arrangement of the heating element 210, they may be configured to correspond to the heating element 210. For example, a plurality of first fixing units 227 and a plurality of second fixing units 228 may be disposed alternately with each other.

The first fixing unit 227 and the second fixing unit 228 may have the same or similar configuration. However, the size of a detailed component is formed differently depending on the size of the heating element 210. That is, when a relatively large size of the heating element 210 may be supported on the first fixing unit 227 and a relatively small size of the heating element 210 may be supported on the second fixing unit 228.

In addition, the third fixing unit 229 may have a similar configuration to those of the first and second fixing units 227 and 228. However, the third fixing unit 229 may accommodate a heating element 210 in which the element penetration part 215 is provided on the element main body 212, and a penetration part 224 of the fixing guide 220 to be described below may be provided in a receiving part 221 of the fixing guide 220 to be described below.

The fixing guide 220 may include the receiving part 221 that receives the element main body 212 and a receiving protrusion 222 that supports the side surface of the element main body 212. The receiving part 221 may be formed at a front surface of the fixing guide 220 and may be formed in a shape corresponding to the front surface of the element main body 212.

A heat transfer part 226 for transferring heat may be provided in the receiving part 221. The heat transfer part 226 may be an opening penetrating the receiving part 221, and through the heat transfer part 226, heat of the heating element 210 passes through the electric board 201 and may be transmitted to the outside.

The receiving part 221 may be defined by a plurality of the receiving protrusions 222. The plurality of receiving protrusions 222 may be positioned to support at least one side surface of the element main body 212. Therefore, the plurality of receiving protrusions 222 fix the heating element 210 so that it does not move, and arrange the heating element 210 on the electric board 201 during the fastening process.

The plurality of receiving protrusions 222 may include a first receiving protrusion 222a, a second receiving protrusion 222b spaced apart and disposed in a direction with the first receiving protrusion 222a, and a third receiving protrusion 222c spaced apart and disposed in another direction from the second receiving protrusion 222b.

The first and second receiving protrusions 222a and 222b may be disposed at both side of the heat transfer part 226. For example, the first receiving protrusion 222a may be disposed above the heat transfer part 226 and the second receiving protrusion 222b may be disposed below the heat transfer part 226.

The receiving part 221 corresponds to a front surface of the heating element 210 and may have a substantially rectangular shape (not limited thereto). A first side surface of the receiving part 221 may be defined by the first and second receiving protrusions 222a and 222b, a second side surface may be defined by the third receiving protrusion 222c, and a third side surface may be defined by a virtual extension line extended from the first receiving protrusion 222a to the second receiving protrusion 222b.

Thus, when the element main body 212 is placed in the receiving part 221, upper and lower surfaces of the element main body 212 may be supported by the first and second receiving protrusions 222a and 222b and a one side surface of the element main body 212 may be supported by the third receiving protrusion 222c.

The fixing guide 220 may further include a supporting part 223 that supports the element heat radiating part 214. The supporting part 223 may be located adjacent to the receiving part 221 and projected forward from the front surface of the fixing guide 220. Thus, the supporting part 223 may support the element heat radiating part 214 projected from one surface of the element main body 212. The supporting part 223 may be identically formed with a width of the element main body 212 so that the element heat radiating part 214 of the heating element 210 is parallel with the heat sink 110.

However, since a heating element 210 in which the element heat radiating part 214 does not protrude from the element main body 212 is seated on the third fixing unit 229, the supporting part 223 may be omitted.

The fixing guide 220 may further include the penetration part 224 in which the head part 230a of the heating element fastening member 230 is accommodated. The penetration part 224 may be an opening penetrating the fixing guide 220, and may be formed to a size corresponding to the diameter of the head part 230a of the heating element fastening member 230. The penetration part 224 may be configured to correspond to the element penetration part 215. Therefore, the first fixing unit 227 and the second fixing unit 228 may be configured to penetrate the supporting part 223, and the third fixing unit 229 may be configured to penetrate the receiving part 221. Since the penetration part 224 provides a space in which the head part 230a of the heating element fastening member 230 may be accommodated, the penetration part 224 may be understood as 'a head part receiving part.'

Since the penetration part 224 may prevent the head part 230a of the heating element fastening member 230 from protruding to the rear surface of the electric board 201, a concern of the interference with a structure located on the rear surface of the electric board 201 is reduced, and when constituting the fixing guide 220 as a non-conductor, the penetration part 224 may insulate the heating element fastening member 230 which is made as a conductor. In addition, since the penetration part 224 does not directly fasten the heat sink 110 to the electric board 201, according to the shape of the heat sink 110, it may prevent the electric board 201 and the heating element 210 from being damaged.

When the heat radiating part 100 is fastened to the electric unit 200, the heating element fastening part 113 of the heat sink 110, the element penetration part 215 of the heating element 210, the penetration part 224 of the fixing guide 220, and the board penetration part 202 of the electric board 201 may be arranged along one extension line which is vertical to the electric board 201, and the heating element fastening member 230 may be fastened to the heating element fastening part 113 and may closely position the heating element 210 to the heat sink 110.

Here, the heating element fastening part 113 of the heat sink 110 and the element penetration part 215 of the heating element 210 may have a diameter corresponding to the outer diameter of the screw part 230b of the heating element fastening member 230. Thus, because the penetration part 224 of the fixing guide 220 and the board penetration part 202 of the electric board 201 each have a greater area than the outer diameter of the head part 230a of the heating element fastening member 230, the operator may determine the location of the element penetration part 215 of the heating element 210 from the rear of the electric board 201 through the penetration part 224 of the fixing guide 220 and the board penetration part 202 of the electric board 201. Therefore, upon assembly of the outside unit, the operator may check the element penetration part 215 at the rear of the electric board 201 and easily assemble the heating element 210.

In addition, since the element heat radiating part 214 and the heat sink 110 can be directly fastened to each other through the heating element fastening member 230, heat of the element heat radiating part 214 may be transferred to the heat sink 110, and thus the radiating performance is improved. Moreover, since the fixing guide 220 is inserted between the heating element 210 and the electric board 201, and may function as a buffer, it may prevent the heating element 210 from being damaged by vibration of the heat radiating part 100 occurring in the fastening and repair step.

The fixing guide 220 may further include fixing parts 225 and 235 to attach the fixing guide 220 to the electric board 201 or the heat sink 110. More specifically, the fixing parts 225 and 235 may include a first fixing part 225 to attach the fixing guide 220 to the electric board 201 and a second fixing part 235 to attach the fixing guide 220 to the heat sink 110.

The first fixing part 225 may attach a rear surface of the fixing guide 220 to the front surface of the electric board 201. The first fixing part 225 may include an extension part 225a that extends from the rear surface to the rear of the fixing guide 220, and a rack part 225b that is bent and extended from an end to one side of the extension part 225a.

The extension part 225a may be extended so as to correspond to the thickness of the electric board 201. In addition, the rack part 225b may be formed so that an inner surface thereof is in contact with the rear surface of the electric board 201. The rack part 225b may be formed to have an inclined surface on an outer surface thereof. The inclined surface may function to guide the first fixing part 225 so that it can be easily inserted into the electric board 201. The rack part 225b may be formed to be inclined in only one direction.

It is understood that there may be more than one first fixing part 225 depending on the size or shape of the fixing guide 220. For example, a plurality of first fixing parts 225 may be disposed so as to make a single column.

The rack part 225b of the first fixing part 225 which is adjacently disposed may include an inclined surface inclined in a different direction. For example, among the two adjacent first fixing parts 225, the rack part 225b of any one of the first fixing part 225 may have an inclined surface inclined to one side, and the rack part 225b of the other one of the first fixing part 225 may have an inclined surface inclined to another side.

The second fixing part 235 may be interposed between the heat sink 110 and the electric unit 200 and attach the fixing guide 220 to the heat sink 110, as well as accommodate the head part 231a of the fixing guide fastening member 231. The second fixing part 235 may be provided at one surface of the fixing guide 220. For example, the second fixing part 235 may be provided at an upper side of the fixing guide 220.

A front surface of the second fixing part 235 may be in contact with the rear surface of the heat sink 110, and a rear surface thereof may be in contact with the front surface of the electric board 201. Therefore, the front surface of the second fixing part 235 may be formed to have the same plane with a front surface of the element heat radiating part 214. The rear surface of the second fixing part 235 may be formed to have the same plane with the rear surface of the fixing guide 220.

The second fixing part 235 may include a head part receiving part 235a recessed from the rear surface to the front, a pressing surface 235b that forms a lower surface of the head part receiving part 235a, and a screw part penetration part 235c that penetrates from the pressing surface 235b to the front surface of the second fixing part 235.

The head part receiving part 235a may have a diameter or size corresponding to the diameter or size of the head part 231a of the fixing guide fastening member 231, and the screw part penetration part 235c may have a diameter or size corresponding to the diameter or size of the screw part 231b of the fixing guide fastening member 231. In other words, the head part receiving part 235a may be formed larger than the screw part penetration part 235c.

The fixing guide fastening member 231 may be fastened toward the screw part penetration part 235c side from the head part receiving part 235a side such that the screw part 231b of the fixing guide fastening member 231 passes through the screw part penetration part 235c and is inserted into the fixing guide fastening part 114 provided on the heat sink 110, and the head part 231a of the fixing guide fastening member 231 is accommodated in the inside of the head part receiving part 235a. Thus, because, the head part 231a of the fixing guide fastening member 231 presses the pressing surface 235b, the front surface of the second fixing part 235 may be disposed close to the rear surface of the heat sink 110.

Hereinafter, the cooling operation of the electric unit 200 according to an embodiment of the present disclosure will be briefly described.

When the outside unit 1 is operated, heat is generated by the driving of the heating element 210 such as the power module. The generated heat may be transmitted directly to the closely contacted heat sink 110. Since the heat sink 110 may be composed of aluminum or a plastic material having a high thermal conductivity, the heat sink may quickly absorb the heat generated in the heating element 210, and accordingly, heat of the heat sink 110 may be raised.

Meanwhile, a refrigerant cycle is driven while the outside unit 1 is driven, and a refrigerant condensed in the outside heat exchanger 31 flows along the cooling pipe 115 and is introduced to the interior of the heat sink 110. In the process of the refrigerant at a relatively low temperature passing through the interior of the heat sink 110, the heat sink 110 may be quickly cooled. That is, by the difference in temperature between the refrigerant at about 30 degrees Celsius and the heat sink 110 at about 70 to 80 degrees Celsius, the cooling of the heat sink 110 may be made efficiently. And the refrigerant passing through the heat sink 110 is introduced to the main expansion valve 34, and then circulates in the air conditioner through a plurality of pipes.

Hereinafter, a fastening of the heat sink 110, the heating element 210, the fixing guide 220, and the electric board 201 according to an embodiment of the present disclosure will be briefly described.

First, the fixing guide 220 is fixed to the front surface of the electric board 201. By inserting the first fixing part 225 located at the rear surface of the fixing guide 220 to a plurality of openings of the electric board 201, the fixing guide 220 may be fixed. At this time, the penetration part 224 of the fixing guide 220 and the head part receiving part 235a of the second fixing part 235 are aligned on the board penetration part 202 of the electric board 201.

In addition, the heating element 210 may be disposed on an element receiving part 220 located at the front surface of the fixing guide 220. At this time, the front surface of the heating element 210 faces the front surface of the fixing guide 220, and the element heat radiating part 214 located on a rear surface of the heating element 210 is located to face the front. At this time, the element penetration part 215 of the heating element 210 is arranged on the penetration part 224 of the fixing guide 220.

The heat sink 110 is disposed at the rear surface of the heating element 210, that is, the element heat radiating part 214. At this time, the heating element fastening part 113 provided at the rear surface of the heat sink 110 is arranged to the element penetration part 215 of the heating element 210, and the fixing guide fastening part 114 provided on the rear surface of the heat sink 110 is arranged on the screw part penetration part 235c of the second fixing part 235. Therefore, through the board penetration part 202, the alignment of the heating element fastening part 113 and the fixing guide fastening part 114 may be confirmed at the rear of the electric board 201.

The heating element fastening member 230 may be inserted from the board penetration part 202 side to the heating element fastening part 113 side. The heating element fastening member 230 thus attaches the heating element 210 to the heat sink 110. Also, the head part 230a of the heating element fastening member 230 is accommodated in the inside of the penetration part 224 of the fixing guide 220.

The fixing guide fastening member 231 is fastened from the board penetration part 202 side to the fixing guide fastening part 114 side. More particularly, the screw part 231b of the fixing guide fastening member 231 passes through the screw part penetration part 235c of the second fixing part 235 and is accommodated in the fixing guide fastening part 114, and the head part 231a of the fixing guide fastening member 231 is accommodated in the head part receiving part 235a of the second fixing part 235, and presses the pressing surface 235b.

When fastened in this way, since the fixing guide 220 prevents the movement of the heating element 210, the operator may fasten the heat sink 110, the heating element 210 and the electric board 201 at a time at the rear of the electric board 201, so that the productivity may be increased.

Figure 8:
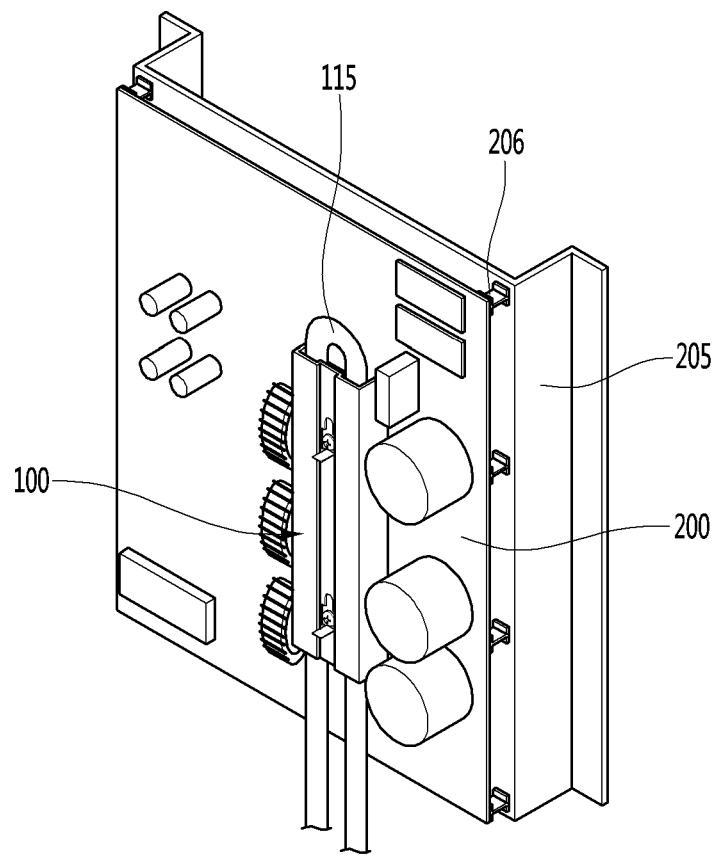
FIG. 8 to FIG. 10 are perspective views illustrating separation of a heat radiating part of the outside unit according to an embodiment of the present disclosure.
Figure 9:
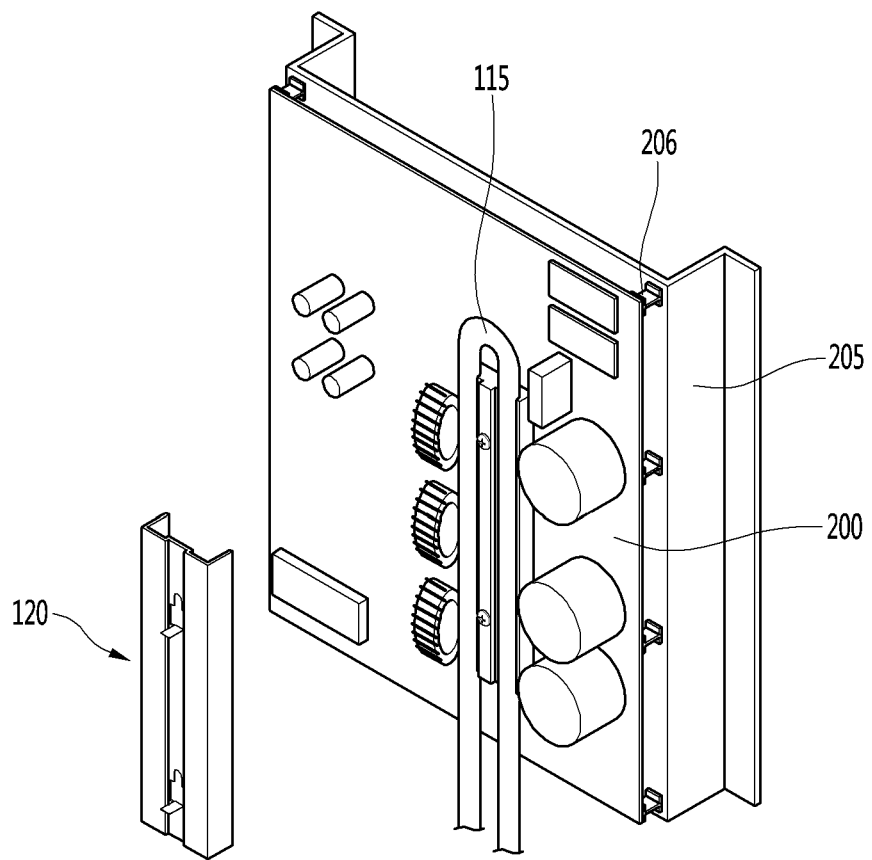
Figure 10:
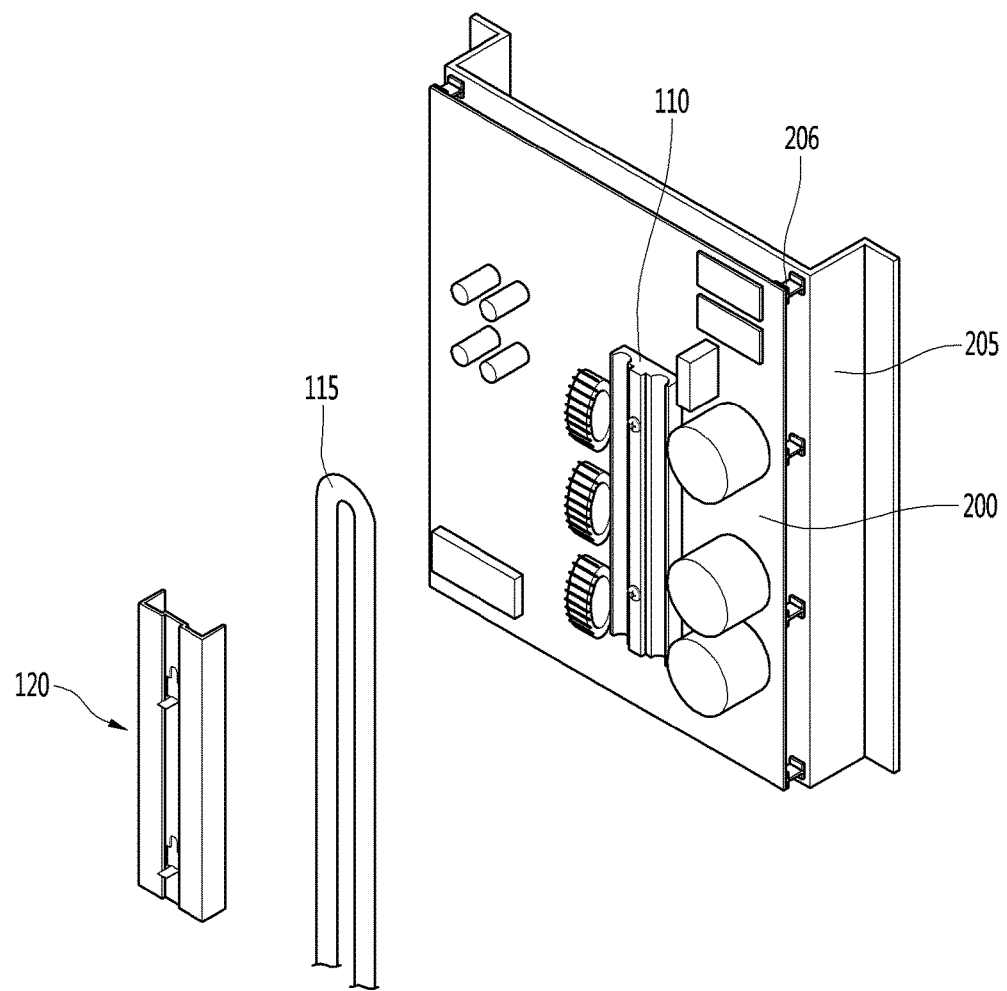

FIGS. 8, 9, and 10 are perspective views illustrating separation of a heat radiating part of the outside unit according to an embodiment of the present disclosure. Hereinafter, the process of separation or combination of a cover and a cooling pipe is simply described.

Referring to FIGS. 8, 9, and 10, first, the operator slides the cover 120 to the upper side by using the handle 124. At this time, the cover fastening member 130 penetrating the first penetration part 127 is accommodated in the second penetration part 128. Since the first penetration part 127 and the second penetration part 128 have a size corresponding to the diameter of the screw part 130b of the cover fastening member 130, the cover 120 may be slid forward.

By pulling the cover 120 forward, the cover 120 is separated from the heat sink 110. At this time, since the second penetration part 128 has a larger area than the head part 130a of the cover fastening member 130, the cover 120 may be separated without separating the cover fastening member 130 from the cover fastening part 112. The cooling pipe 115 may then be detached from the pipe seating part 111 by pulling the cooling pipe 115 forward.

In contrast, when the cover 120 and the cooling pipe 115 are fastened to the heat sink 110, first, the refrigerant pipe 115 is disposed at the pipe seating part 111. And, the cover 120 is moved to the rear so that the second penetration part 128 penetrates the cover fastening member 130. And, the cover 120 is slid downward so that the cover fastening member 130 penetrating the second penetration part 128 is accommodated in the first penetration part 127.

At this time, since the first penetration part 127 is formed to be smaller than the head part 130a of the cover fastening member 130, the cover 120 may be fixed to the heat sink 110. When the cover 120 is fixed to the heat sink 110, the refrigerant pipe 115 is fixed or secured between the heat sink 110 and the cover 120. Further, since the cover hanging part 125 is in contact with the upper surface of the heat sink 110, the cover 120 may be supported.

As provided above, the present disclosure provides significant improvements and advantages over conventional structures and methods. According to the present disclosure, since the electric unit is cooled via the refrigerant, a malfunction of the control component provided in the electric unit may be prevented and the failure of the air conditioner may be prevented.

Additionally, because the heating element is directly fastened to the heat sink without including a separate heat transfer part, the heat exchange performance may be improved.

Additionally, because the heating element may be fastened to the heat sink at the rear of the electric board due to the fixing guide fixing the heating element between the heat sink and the electric board, the productivity may be improved.

Additionally, because the fastening member is not fastened to the electric board, the breakage of the electric board according to the movement of the heat sink may be prevented, and since the head part of the fastening member is accommodated in the inside of the fixing guide without protruding from the rear surface of the electric board, the electric board may be easily disposed on the outside unit.

Additionally, because the fixing guide accommodates the heating element, the heating element may be prevented from being damaged by a compression force which may occur between the heat sink and the electric board.

Additionally, the fixing guide may fix the plurality of heating elements to be in close contact with in close contact with the rear surface of the heat sink.

Additionally, because the cooling pipe may be spaced apart from the heat sink by separating the cover, the air conditioner may be easily maintained and repaired.

Additionally, because the cover may be separated from the heat sink without separating the fastening member, the refrigerant pipe is conveniently separated.

Additionally, because the cover may be fixed or separated according to the position of the fastening part, the cover may be prevented from being optionally separated.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. An air conditioner comprising:
a compressor to compress a refrigerant;
an outside heat exchanger to heat-exchange the refrigerant with outside air; and
an electric unit to control a cooling cycle in which the refrigerant is circulated,
wherein the electric unit comprises:
a heat sink including a first surface at which a cooling pipe for cooling the electric unit is attached and a second surface at which a fastening part is provided,
an electric board having a first penetration part, the electric board being spaced apart from a side of the heat sink,
a heating element having a second penetration part in communication with the first penetration part, the heating element being provided between the heat sink and the electric board,
a fixing guide having a third penetration part in communication with the first and second penetration parts, the fixing guide being provided between the heating element and the electric board, and
a fastening member attaching the heat sink with the heating element,
wherein the fastening member comprises:
a head part supported at one side of the third penetration part through the first penetration part, and a screw part that extends from the head part to the heating element and is attached to the fastening part of the heat sink,
wherein the head part is wider than a diameter of the screw part, and the head part is in contact with an inner circumferential surface of the third penetration part and the screw part is inserted into the fastening part of the heat sink through the second penetration part,
wherein the first penetration part is wider than a diameter of the head part, and
the third penetration part is formed such that that an outer circumferential surface of the head part is in contact with an inner circumferential surface of the third penetration part.

2. The air conditioner of claim 1, wherein the first, second, and third penetration parts are arranged side by side, and the fastening member passes through the first penetration part, the second penetration part, and the third penetration part.

3. The air conditioner of claim 1, wherein the heating element comprises an element main body, and the fixing guide further comprises a receiving part at which the element main body is received and a plurality of receiving protrusions to support a side surface of the element main body,
whereby the receiving protrusions include a first protrusion, a second protrusion spaced apart from the first protrusion toward a first direction, and a third protrusion spaced apart from the second protrusion toward a second direction, and
whereby the element main body includes a first surface supported by the first and second protrusions, and a second surface supported by the third protrusion.

4. The air conditioner of claim 3, wherein the second penetration part includes a first opening formed through the element main body, and the third penetration part includes a second opening formed through the receiving part.

5. The air conditioner of claim 3, wherein the heating element further comprises a leg extended from a surface of the element main body and forming an electrode of the element main body,
whereby the leg is bent toward a front surface of the electric board and attached to the electric board.

6. The air conditioner of claim 3, wherein the fixing guide comprises a heat transfer part to discharge heat of the element main body, and
the heat transfer part includes an opening formed through the receiving part.

7. The air conditioner of claim 3, wherein the heating element further comprises a heat radiating part to discharge heat of the element main body to the outside, the heat radiating part extending from a surface of the element main body,
wherein the fixing guide includes a supporting part to accommodate the heat radiating part, the supporting part being located at one side of the receiving part and having a height that corresponds to a thickness of the element main body.

8. The air conditioner of claim 7, wherein the second penetration part includes an opening formed through the heat radiating part, and the third penetration part includes an opening formed through the supporting part.

9. The air conditioner of claim 1, further comprising
a first fixing part attaching the fixing guide to the electric board,
wherein the first fixing part comprises an extension part that extends from a rear surface of the fixing guide to a rear surface of the electric board,
whereby the extension part penetrates the electric board, and the rear surface of the fixing guide is in contact with a front surface of the electric board.

10. The air conditioner of claim 9, wherein the first fixing part further comprises a rack part that is bent from a rear end of the extension part and presses against the rear surface of the electric board through the electric board.

11. The air conditioner of claim 9,
wherein the fastening part comprises a first fastening part and a second fastening part,
wherein the fastening member comprises a first fastening member inserted into the first fastening part to attach the heating element to the heat sink, and a second fastening member inserted into the second fastening part to attach the fixing guide to the heat sink.

12. The air conditioner of claim 11, further comprising
a second fixing part having a front surface in contact with a rear surface of the heat sink,
wherein the second fixing part comprises:
a head part receiving part that is recessed from the rear surface of the second fixing part,
a pressing surface that forms a low surface of the head part receiving part, and
a screw part penetration part that is penetrated from the pressing surface to the front surface of the second fixing part.

13. The air conditioner of claim 12,
wherein the second fastening member passes through the second fastening part to attach the fixing guide to the heat sink,
a head part of the second fastening member is accommodated in the head part receiving part, and
a screw part of the second fastening member is accommodated in the second fastening part through the screw part penetration part.

14. An air conditioner comprising:
a compressor to compress a refrigerant;
a heat exchanger to heat-exchange the refrigerant with outside air;
an electric unit to control a cooling cycle in which the refrigerant is circulated; and
a heat radiating part attached to the electric unit to cool the electric unit,
wherein the heat radiating part comprises:
a heat sink to transfer heat of the electric unit to the refrigerant, the heat sink being attached to the electric unit,
a cooling pipe to guide a flow of the refrigerant for cooling the electric unit, the cooling pipe being provided at the heat sink,
a cover structure to cover the cooling pipe, the cover being detachably fastened to one surface of the heat sink, and
a fastening member,
wherein, when the cover structure is separated from the heat sink, the cooling pipe is spaced apart from the heat sink, and when the cover structure is attached to the heat sink, the cooling pipe is in contact with the heat sink,
wherein the fastening member includes, a screw part to fasten the cover structure to the heat sink, and a head part that is wider than a diameter of the screw part,
wherein the cover structure includes a first penetration part and a second penetration part extended from the first penetration part, and wherein, when the cover is coupled to the heat sink, the fastening member is located at the first penetration part and the cooling pipe is fixed between the cover and the heat sink.

15. The air conditioner of claim 14, wherein when the cover structure is separated from the heat sink, the fastening member is located at the second penetration part.

16. The air conditioner of claim 15, wherein the second penetration part is larger than both the first penetration part and the head part so that the head part of the fastening member passes through the second penetration part.

* * * * *